(12) United States Patent
Moriwaki

(10) Patent No.: US 7,605,024 B2
(45) Date of Patent: Oct. 20, 2009

(54) ELECTRO-OPTIC DEVICE, METHOD FOR MANUFACTURING THE SAME, AND ELECTRONIC APPARATUS

(75) Inventor: Minoru Moriwaki, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 126 days.

(21) Appl. No.: 11/612,231

(22) Filed: Dec. 18, 2006

(65) Prior Publication Data

US 2007/0145370 A1 Jun. 28, 2007

(30) Foreign Application Priority Data

Dec. 27, 2005 (JP) ............................. 2005-376076

(51) Int. Cl.
*H01L 21/00* (2006.01)
(52) U.S. Cl. ........................................ 438/149; 257/59
(58) Field of Classification Search .................. 257/59; 438/149

See application file for complete search history.

(56) References Cited

U.S. PATENT DOCUMENTS

| | | | | |
|---|---|---|---|---|
| 5,334,859 A | * | 8/1994 | Matsuda | 257/57 |
| 5,684,555 A | * | 11/1997 | Shiba et al. | 349/149 |
| 5,804,472 A | * | 9/1998 | Balasinski et al. | 438/158 |
| 5,814,377 A | * | 9/1998 | Robles et al. | 427/579 |
| 2001/0004479 A1 | * | 6/2001 | Cheung et al. | 427/553 |
| 2001/0008795 A1 | * | 7/2001 | Terauchi et al. | 438/637 |
| 2001/0022365 A1 | * | 9/2001 | Murade | 257/59 |
| 2002/0074547 A1 | * | 6/2002 | Yudasaka et al. | 257/57 |

FOREIGN PATENT DOCUMENTS

JP    A 2002-156652    5/2002

* cited by examiner

*Primary Examiner*—Bradley K Smith
*Assistant Examiner*—Jami M Valentine
(74) *Attorney, Agent, or Firm*—Oliff & Berridge, PLC

(57) ABSTRACT

An electro-optic device includes data lines and scanning lines extending to cross each other on a substrate, pixel electrodes disposed on the substrate for respective pixels defined corresponding to the data lines and the scanning lines in a plan view of the substrate, thin film transistors electrically connected to the respective pixel electrodes, and at least one amorphous wiring including an amorphous film and disposed in a region containing a region opposite to a channel region of each of the thin film transistors in a plan view of the substrate and in a layer different from that of semiconductor films of the thin film transistors.

2 Claims, 8 Drawing Sheets

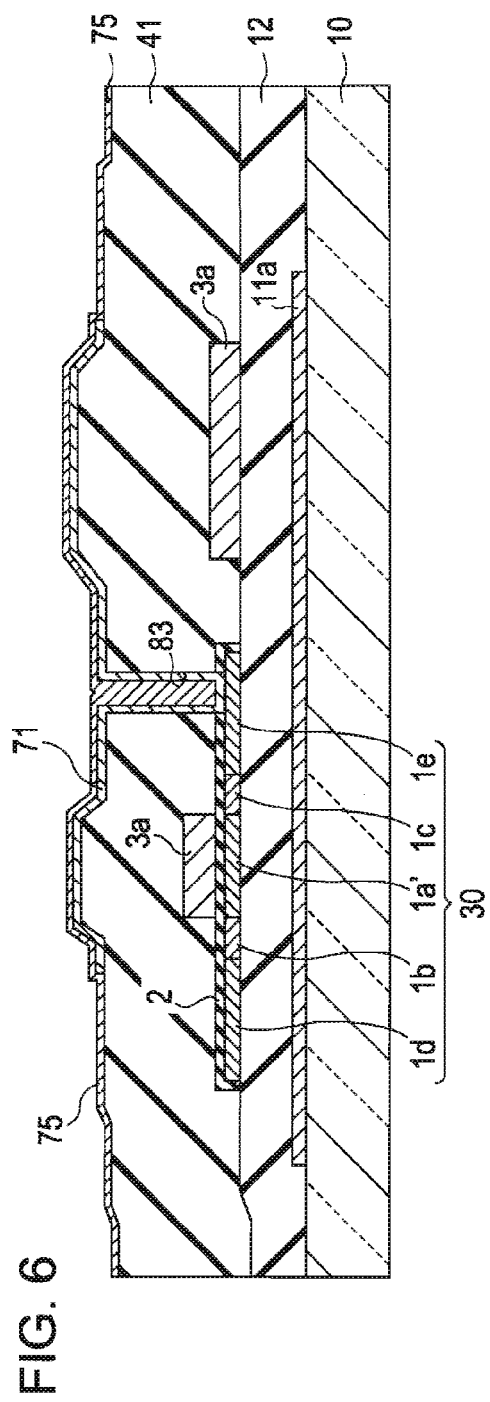
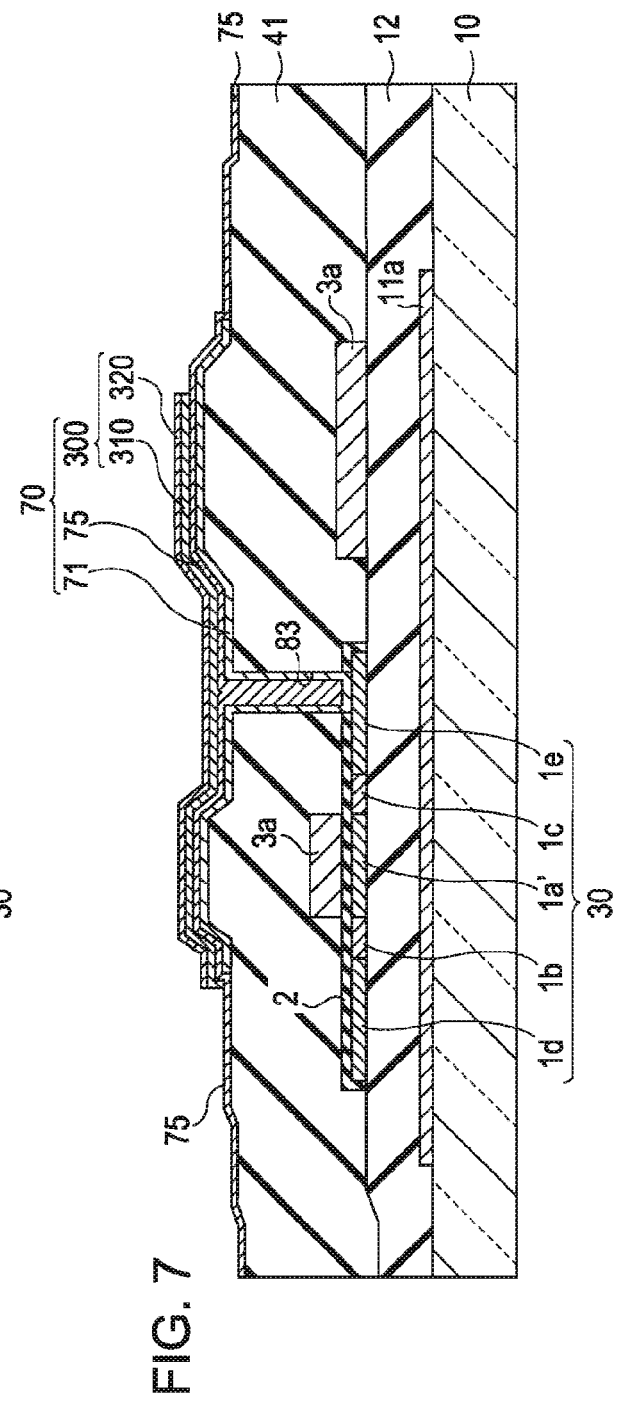

ELECTRO-OPTIC DEVICE, METHOD FOR MANUFACTURING THE SAME, AND ELECTRONIC APPARATUS

BACKGROUND

1. Technical Field

The present invention relates to an electro-optic device such as a liquid crystal device, a method for manufacturing the same, and an electronic apparatus such as a liquid crystal projector, including the electro-optic device.

2. Related Art

Such an electro-optic device includes pixel electrodes, scanning lines for selectively driving the pixel electrodes, data lines, and TFTs (Thin Film Transistor) serving as pixel switching elements, which are provided on a substrate, so that active matrix drive is enabled. In order to increase contrast, a storage capacitor may be provided between each of the TFTs and the corresponding pixel electrode. These components are formed at a high density on the substrate to improve the numerical aperture of pixels and decrease the size (refer to, for example, Japanese Unexamined Patent Application Publication No. 2002-156652).

In this way, an electro-optic device has been required to have further improved display quality, a smaller size, and higher definitions and various measures other than the above have been conducted. For example, when light is incident on semiconductor layers of TFTs, light leakage current occurs to degrade display quality. Therefore, in order to improve the light resistance of an electro-optic device, a light shielding layer is provided around each semiconductor layer. In particular, light intensity has recently been increased for increasing clearness of images, and, accordingly, further improvement in the light shielding ability has been demanded. Although a storage capacitor is preferably as large as possible, it is desirable to design a storage capacitor not to sacrifice the numerical aperture of pixels.

However, according to the above-described technique, a laminated structure on a substrate is basically complicated and advanced with increases in function and performance. This further causes complication and advancement of a manufacturing method, a decrease in manufacture yield, and the like. Conversely, if the laminated structure on the substrate and the manufacturing process are simplified, there may occur the technical problem of decreasing display quality due to a decrease in the light shielding ability or the like.

SUMMARY

An advantage of some aspects of the invention is that it provides an electro-optic device excellent in light resistance and capable of high-quality display, a method of manufacturing the same, and an electronic apparatus including the electro-optic device.

In accordance with an embodiment of the invention, an electro-optic device includes data lines and scanning lines extending to cross each other on a substrate, pixel electrodes disposed on the substrate for respective pixels defined corresponding to the data lines and the scanning lines in a plan view of the substrate, thin film transistors electrically connected to the respective pixel electrodes, and at least one amorphous wiring including an amorphous film and disposed in a region containing a region opposite to a channel region of each of the thin film transistors and in a layer different from that of the semiconductor films of the thin film transistors.

In an operation of the electro-optic device, when data signals are applied from the data lines to the pixel electrodes at pixel positions selected by the scanning lines, matrix drive may be made using the thin film transistors. In this case, the potential retention of the pixel electrodes is improved by, for example, storage capacitors electrically connected to the pixel electrodes, thereby improving display contrast.

In particular, in according with the embodiment of the invention, in a plane view of the substrate, the at least one amorphous wiring containing an amorphous film is disposed in a region containing a region opposite to the channel region of each of the thin film transistors and in a layer different from that of the semiconductor films of the thin film transistors. As the amorphous film, for example, an amorphous WSi (tungsten silicon) film may be used. The amorphous film has a higher light shielding ability as compared with a crystallized or solid light shielding conductive film such as a WSi polycide film or the like. Therefore, the channel regions of the thin film transistors are securely shielded from incident light or return light by the amorphous wiring. In other words, when the amorphous wiring is provided above the semiconductor films of the thin film transistors, the channel regions of the thin film transistors are securely shielded from light incident on the upper layer side. On the other hand, when the amorphous wiring is provided below the semiconductor films of the thin film transistors, the channel regions of the thin film transistors are securely shielded from return light from the lower layer side, such as light reflected from the back of the substrate and light emitted from another electro-optic device and passing through a synthesis optical system in a double-plate projector the amorphous wiring may be provided on both the upper-layer side and the lower-layer side of the semiconductor films of the thin film transistors. In this case, the channel regions of the thin film transistors are securely shielded from both light incident on the upper layer side and light returned from the lower layer side, thereby further increasing the light shielding ability. As a result, in the above-described operation, it may be possible to decrease light leakage currents in the thin film transistors and suppress or prevent the occurrence of flicker or pixel nonuniformity in an image display, thereby permitting a high-quality image display.

Furthermore, if a crystallized light-shielding conductive film such as a WSi polycide film is formed, it is preferable that impurity-doped polysilicon is deposited (i.e., DPLY deposition), and then WSi is deposited by sputtering to form a laminated film (i.e., DPLY/WSi laminated film) having a laminated structure in which polysilicon and WSi are laminated, followed by heat treatment at, for example, 500° C. or more, for alloying. The heat treatment causes warping or cracking in the wiring due to the stress applied by alloying, thereby causing difficulty in functioning as the wiring. However, according to the embodiment of the invention, heat treatment at a high temperature, for example, 500° C. or more, may not performed for forming the amorphous film. In other words, the amorphous film is preferably set at a temperature lower than 500° C., for maintaining the amorphous film in an amorphous state, thereby causing substantially no or no warping or cracking in, the amorphous wiring. Therefore, the amorphous wiring including the amorphous film alone functions as wiring by itself. As a result, for example, when the amorphous wiring is caused to function as an upper electrode of a storage capacitor or capacity wiring, the channel regions of the thin film transistors are securely shielded from light without complication of the laminated structure. In addition, since substantially no or no warping or cracking occurs in the amorphous wiring, the yield is improved, and the device reliability is increased.

Furthermore, the amorphous wiring functions as wiring by itself, and thus it may be unnecessary that in order to decrease the resistance, conductive films disposed in different layers with, for example, an interlayer insulating film provided therebetween, are electrically connected through contact holes to form a retardant wiring structure such as double wiring. Therefore, the laminated structure is simplified, thereby permitting high definition. When the resistance of the amorphous wiring is preferably further decreased, the width or thickness of the amorphous wiring may be increased, or the amorphous wiring may be formed in a retardant wiring structure. Alternatively, the amorphous wiring may be formed as a two-layer or multi-layer film having a laminated structure including an amorphous film and a metal film having a lower resistance than that of the amorphous film, e.g., an aluminum film.

As described above, in the electro-optic device according to the embodiment of the invention, light leakage currents in the thin film transistors are decreased without causing complication of the laminated structure, thereby permitting a high-quality image display.

The OD (Optical Density) value of the amorphous film is preferably more than 4.

In this case, since the OD value of the amorphous film is more than 4, i.e., the light transmittance of the amorphous film is less than 0.01%, the channel regions of the thin film transistors are securely shielded from light by the amorphous wiring. The OD value of a crystallized light shielding conductive film, for example, a WSi polycide film, is about 1.2 (i.e., light transmittance of about 6.31%).

It is preferable that the storage capacitor includes a lower electrode, a dielectric film, and an upper electrode which are laminated in that order from the lower layer side, and the storage capacitor is disposed above each of the thin film transistors and in a region including a region opposite to each of the channel regions in a plan view of the substrate and. In addition, a capacity line including the amorphous wiring is preferably further provided to be electrically connected to the upper electrode.

In this case, the amorphous wiring functions as the capacity line, and thus light leakage currents in the thin film transistors are decreased without causing complication of the laminated structure. When the capacity lines are formed integrally with the upper electrodes, the amorphous wiring constitutes the capacity lines and the upper electrodes.

Furthermore, it is preferable that the scanning lines include the amorphous wiring, are disposed above of the semiconductor films and in regions each containing a region opposite to each of the channel regions in a plan view of the substrate, and are electrically connected to the gates of the thin film transistors.

In this case, the amorphous wiring function as the scanning lines, and thus light leakage currents in the thin film transistors are decreased without causing complication of the laminated structure. When the scanning lines are formed to include the gates of the thin film transistors, i.e., the scanning lines are formed integrally with the gates of the thin film transistors, the amorphous wiring constitutes the scanning lines and the gates of the thin film transistors.

It is preferable that the data lines include the amorphous wiring, are disposed above the thin film transistors and in regions each containing a region opposite to each of the channel regions in a plan view of the substrate and are electrically connected to the sources of the thin film transistors.

In this case, the amorphous wiring function as the data lines, and thus light leakage currents in the thin film transistors are decreased without causing complication of the laminated structure.

It is preferable that a lower light shielding film including the amorphous wiring is further provided below the each of thin film transistors and in a region containing a region opposite to each of the channel regions in a plan view of the substrate so as to define the aperture region of each pixel.

In this case, the amorphous wiring functions as the lower light shielding film to define the aperture region of each pixel and to securely shield the channel region of each of the thin film transistors from return light from the lower layer side.

It is further preferable that the amorphous wiring is disposed above the thin film transistors on the substrate.

In this case, it may be possible to easily maintain the amorphous wiring in an amorphous state while improving the characteristics of the thin film transistors by heat treatment such as annealing or the like. Namely, the amorphous wiring need not be subjected to heat treatment.

In accordance with another embodiment of the invention, a method for manufacturing an electro-optic device is adapted to manufacture an electro-optic device including data lines and scanning lines extending to cross each other on a substrate, pixel electrodes disposed on the substrate for respective pixels defined corresponding to the data lines and the scanning lines in a plan view of the substrate, thin film transistors electrically connected to the respective pixel electrodes, and at least one amorphous wiring including an amorphous film and disposed above the thin film transistors and in a region containing a region opposite to a channel region of each of the thin respective thin film transistors. The method includes forming the scanning lines on the substrate, forming the thin film transistors in regions corresponding to the respective intersections of the data lines and the scanning lines in a plan view of the substrate, forming the amorphous wiring including an amorphous film above the thin film transistors and in a region containing the region opposite to the channel region of each of the respective thin film transistors in a plan view of the substrate, forming the data lines on the substrate, and forming the pixel electrodes for the respective pixels.

The method is capable of manufacturing the above-describe electro-optic device. In particular, the amorphous wiring is formed to include an amorphous film, and thus light leakage currents of the thin film transistors are decreased, thereby permitting a high-quality image display. Furthermore, it may be possible to easily form the amorphous wiring on the thin film transistors while improving the characteristics of the thin film transistors by heat treatment such as annealing or the like. Namely, the amorphous wiring may not be subjected to heat treatment and may be maintained in an amorphous state.

The method preferably includes at least one heat treatment for heating at least one of the data lines, the scanning lines, the thin film transistors, and the pixel electrodes at 500° C. or more, the at least one heat treatment being performed before the formation of the amorphous wiring.

in this case, the heat treatment for heating at 500° C. or more is completed before the formation of the amorphous wiring, i.e., before the deposition of the amorphous film. In other words, after the amorphous film is deposited, the heat treatment for heating the amorphous wiring at 500° C. or more is not performed. Therefore, the amorphous wiring is maintained in an amorphous state. Namely, it may be possible to suppress or prevent the crystallization of the amorphous film, thereby suppressing or preventing the occurrence of warping or cracking due to crystallization and improving manufacture yield.

The method preferably further includes forming an interlayer insulating film adjacent to the amorphous wiring and on the upper-layer side thereof by low-temperature plasma enhanced CVD (Chemical Vapor Deposition).

in this case, the interlayer insulating film is formed by low-temperature plasma CVD performed at a low temperature, for example, less than 500° C., such as plasma enhanced CVD (PECVD), or high density plasma CVD (HDPCVD), using TEOS (tetraethyl orthosilicate) gas or the like. Therefore, in forming the interlayer insulating film, heat treatment at, for example 500° C. or more, may not be performed, thereby maintaining the amorphous wiring in an amorphous state.

In accordance with a further embodiment of the invention, an electronic apparatus includes the above-described electro-optic device.

Since the electronic apparatus includes the electro-optic device according to the embodiment, it may be possible to realize various electronic apparatuses such as a television, a cellular phone, an electronic notebook, a word processor, a view finder-type or monitor direct view-type video tape recorder, a work station, a picture telephone, a POS terminal, and a touch panel; and image-forming apparatuses using an electro-optic device as an exposure head, such as a printer, a copy machines and a facsimile. Also, it may be possible to realize electrophoretic devices such as electronic paper and electron emitting devices (Field Emission Display and Conduction Electron-Emitter Display) as the electronic apparatus according to the embodiment of the invention.

The operation and other advantages of the invention will be made clear from "Description of Exemplary Embodiments" below.

BRIEF DESCRIPTION OF THE DRAWINGS

The invention will be described with reference to the accompanying drawings, wherein like numbers reference like elements.

FIG. 6 is a sectional view showing a step of a method for manufacturing the liquid crystal device shown in FIG. 1.

FIG. 7 is a sectional view showing a step of the method for manufacturing the liquid crystal device shown in FIG. 1.

DESCRIPTION OF EXEMPLARY EMBODIMENTS

An embodiment of the invention will be described below with reference to the drawings. In the embodiment described below, a TFT active matrix drive liquid crystal display device with built-in deriver circuits will be described as an example of an electro-optic device according to an embodiment of the invention.

First Embodiment

A liquid crystal display device according to a first embodiment will be described with reference to FIGS. 1 to 5.

Figure 1:
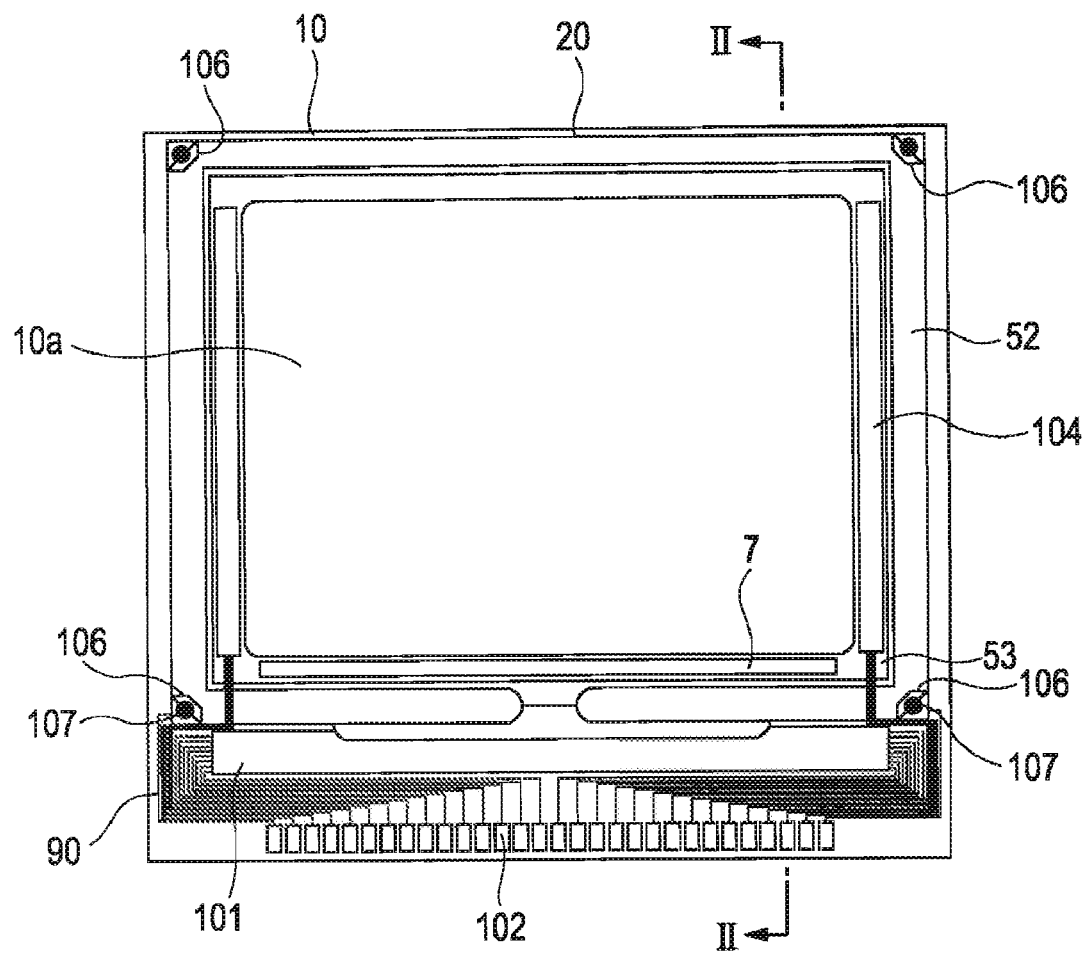
FIG. 1 is a plan view showing the whole constitution of a liquid crystal display device according to a first embodiment of the invention.
Figure 2:
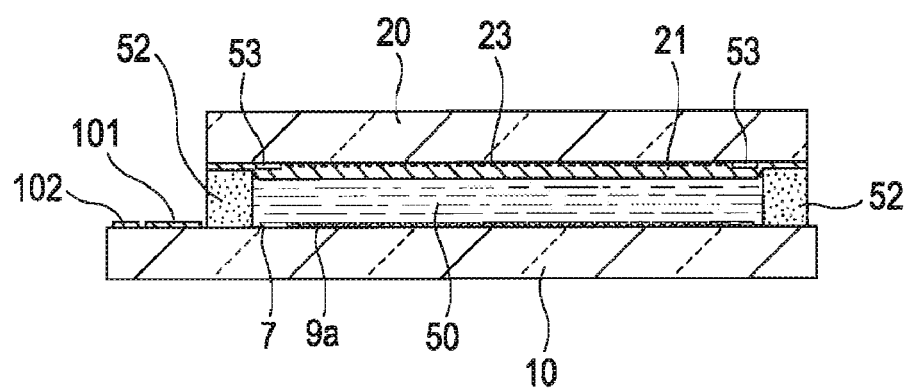
FIG. 2 is a sectional view taken along line II-II in FIG. 1.

First, the whole constitution of the liquid crystal display device according to the first embodiment will be described with reference to FIGS. 1 and 2. FIG. 1 is a plan view showing the whole constitution of the liquid crystal display device according to the embodiment. FIG. 2 is a sectional view taken along line II-II in FIG. 1.

Referring to FIGS. 1 and 2, in the liquid crystal display device according to the embodiment, a TFT array substrate 10 and a counter substrate 20 are opposed to each other. In addition, a liquid crystal layer 50 is sealed between the TFT array substrate 10 and the counter substrate 20, and the TFT array substrate 10 and the counter substrate 20 are bonded together with a sealing material 52 provided in a seal region disposed around an image display region 10a.

In FIG. 1, a frame light-shielding film 53 is provided on the counter substrate 20 in parallel with the inside of the seal region in which the sealing agent 52 has been disposed, for defining the frame region of the image display region 10a. In the peripheral region, a data line driving circuit 101 and external circuit connection terminals 102 are provided in a region outside the seal region in which the sealing material 53 has been disposed, and along one of the sides of the TFT array substrate 10. Furthermore, a sampling circuit 7 is provided inside the seal region and along the one side so as to be covered with the frame light-shielding film 53. Furthermore, scanning line drive circuits 104 are provided inside the seal region and along the two sides adjacent the one side so as to be covered with the frame light shielding film 53. On the TFT array substrate 10, vertical conduction terminals 106 are disposed in regions corresponding to parts of the respective corners of the counter substrate 20, for connecting both substrates with a vertical conduction material 107. As a result, electrical conduction is achieved between the TFT array substrate 10 and the counter substrate 20.

On the TFT array substrate 10, extension wiring 90 is formed for electrically connecting together the external circuit connection terminals 102, the data line drive circuit 101, the scanning line drive circuits 104, and the vertical conduction terminals 106.

In FIG. 2, a laminated structure is formed on the TFT array substrate 10, in which pixel switching TFTs serving as drive elements, scanning lines, and data lines are incorporated. In the image forming region 10a, pixel electrodes 9a are provided above the pixel switching TFTs and wiring such as the scanning lines and the data lines. On the other hand, a light shielding film 23 is formed the side of the counter substrate 20 which opposes the TFT array substrate 10. In addition, a counter electrode 21 composed of a transparent material such as ITO (Indium Tin Oxide) is formed opposite to a plurality of pixel electrodes 9a. The liquid crystal layer 50 includes, for example, a nematic liquid crystal or a mixture containing a plurality of nematic liquid crystals, and assumes a predetermined orientation state between a pair of alignment films.

Although not shown in the drawings, besides the data line drive circuit 101 and the scanning line drive circuits 104, an inspection circuit, an inspection pattern, or the like may be formed on the TFT array substrate 10, for inspecting quality and defects of the liquid crystal display device in the course of manufacture and in shipment.

Figure 3:
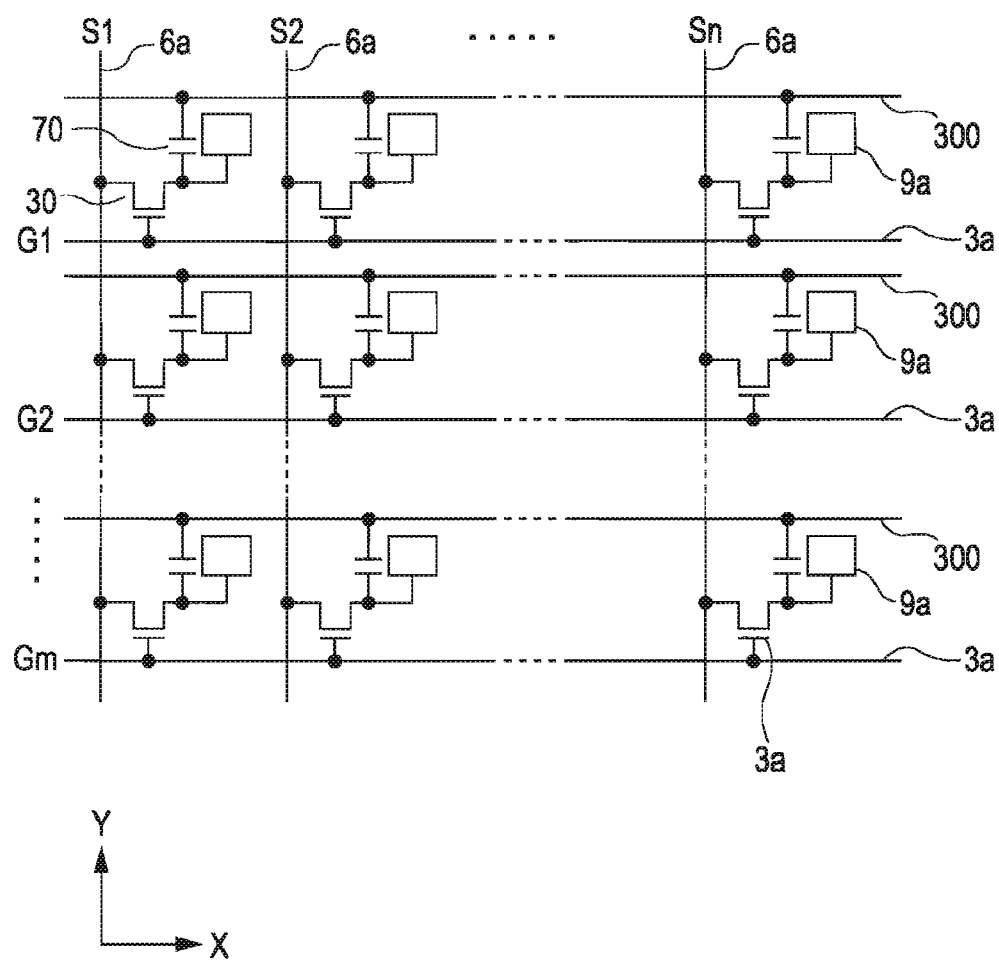
FIG. 3 is a view showing equivalent circuits including elements of pixels in the liquid crystal display shown in FIG. 1.

Next, the electric configuration in a pixel portion of the liquid crystal display device according to the embodiment will be described with reference to FIG. 3. FIG. 3 is a view showing equivalent circuits including elements and wiring of a plurality of pixels formed in a matrix to constitute the image display region of the liquid crystal display.

Referring to FIG. 3, in each of the plurality of pixels formed in a matrix within the image display region 10a (refer to FIG. 1) of the electro-optic device according to this embodiment, the pixel electrode 9a and a TFT 30 for switch control of the pixel electrode 9a are formed. In addition, data lines 6a to which image signals S1, S2, . . . , Sn are supplied are electrically connected to the sources of the TFTs 30. The TFTs 30 are an example of thin film transistors.

Furthermore, scanning lines 3a are electrically connected to the gates of the TFTs 30 so that scan signals G1, G2, . . . , Gm are line-sequentially supplied as pulse signals to the scanning lines 3a in that order. The pixel electrode 9a is electrically connected to the drain of each of the TFTs 30, and the switches of the TFTs 30 serving as switching elements are closed for a predetermined time to write, with predetermined timing, the image signals S1, S2, . . . Sn supplied from the data lines 6a.

The image signals S1, S2, . . . , Sn at a predetermined level written in the liquid crystal of the liquid crystal layer 50 though the pixel electrodes 9a are held for a predetermined time between the liquid crystal and the counter electrode 21 formed on the counter substrate 20. The liquid crystal is changed in orientation and order of a molecular assembly according to the level of the applied voltage to modulate light and permit a gradient display. In a normally white mode, the transmittance of incident light decreases according to the voltage applied by pixel units, while in a normally black mode, the transmittance of incident light increases according to the voltage applied by pixel units, thereby emitting light with a contrast corresponding to the image signals from the liquid display device as a whole.

In order to prevent leakage of the held image signals, a storage capacitor 70 is added in parallel with a liquid crystal capacity formed between each pixel electrode 9a and the counter electrode 21 (refer to FIGS. 1 and 2). Each of the storage capacitors 70 is provided in parallel with the corresponding scanning line 3a and includes a fixed potential-side capacitor electrode and a capacity line 300 at a predetermined potential. By providing the storage capacitor 70, the charge retention property of each pixel electrode is improved. The potential of the capacity lines 300 may be constantly fixed at a voltage value or fixed at a plurality of voltage values at a predetermined period.

Figure 4:
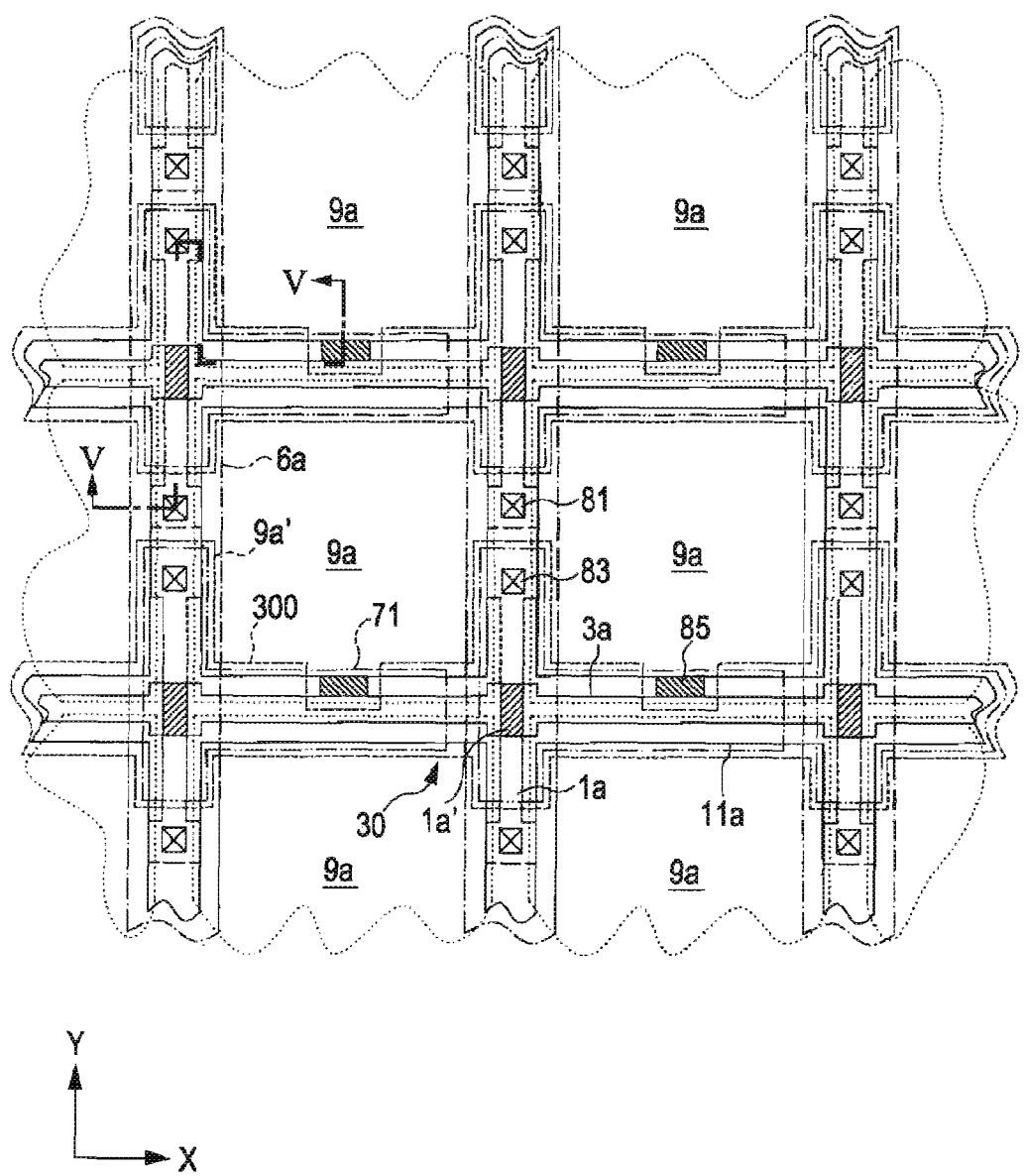
FIG. 4 is a plan view showing a plurality of pixel groups adjacent to each other in the liquid crystal display shown in FIG. 1.
Figure 5:
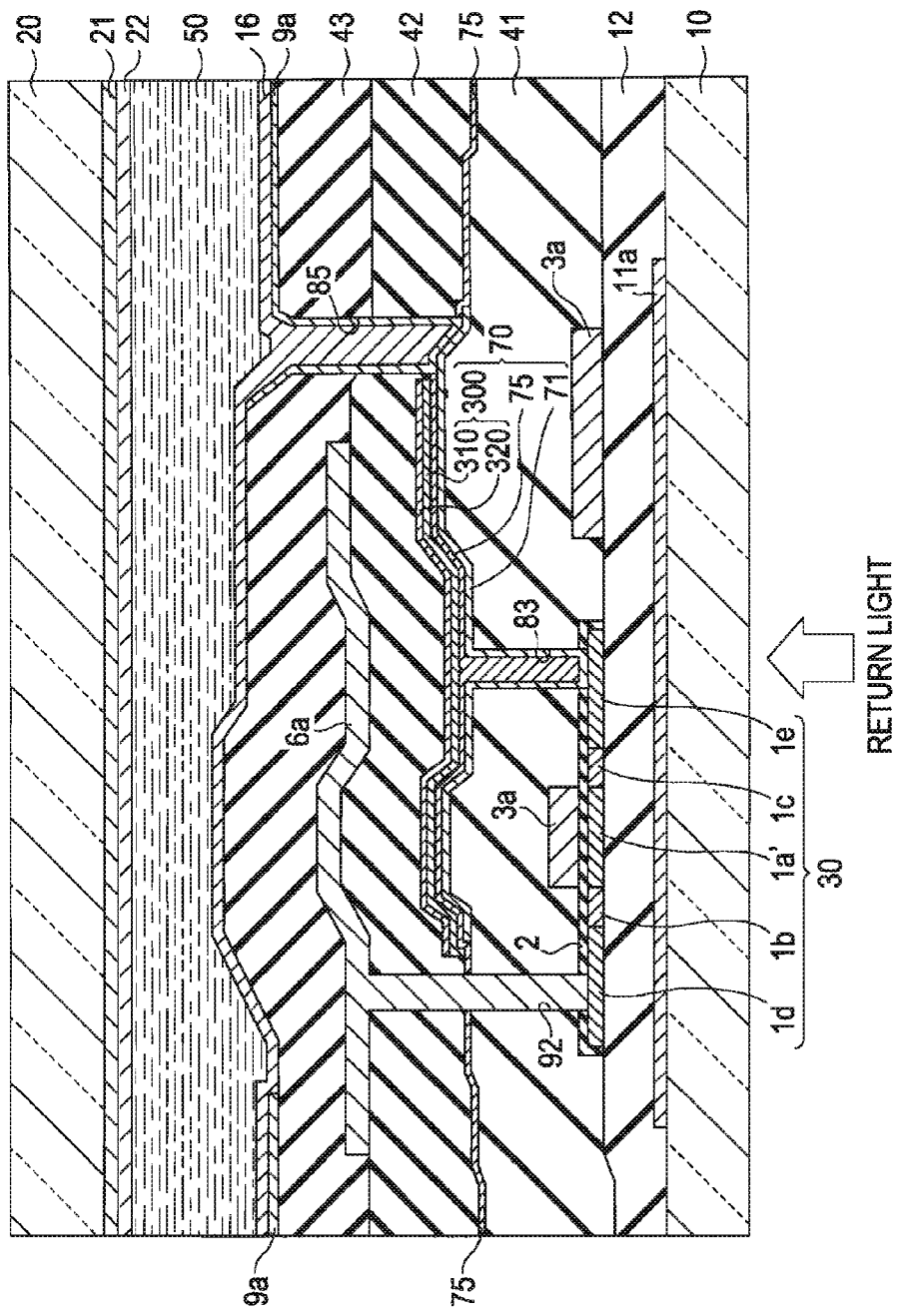
FIG. 5 is a sectional view taken along line V-V in FIG. 4.

Next, with respect to the pixel portion, a specific configuration for realizing the above-described operation will be described with reference to FIGS. 4 and 5. FIG. 4 is a plan view showing a plurality of pixel groups adjacent to each other on the TFT array substrate on which the data lines, the scanning lines, the pixel electrodes, etc. are formed in the liquid crystal display according to this embodiment. FIG. 5 is a sectional view taken along line V-V in FIG. 4.

In FIG. 4, a plurality of pixel electrodes 9a is provided in a matrix on the TFT array substrate 10 (the counters shown by dotted lines 9a'). The data lines 6a and the scanning lines 3a are provided along the column-direction and row-direction boundaries, respectively, of the pixel electrodes 9a. The data lines 6a are composed of a metal film, for example, an aluminum film, or an alloy film, and the scanning lines 3a are composed of, for example, a conductive polysilicon film. The scanning lines 3a are disposed to oppose the channel regions 1a' of the semiconductor layers 1a, the channel regions 1a' being shadowed with right up diagonal lines in FIG. 4. The scanning lines 3a function as gate electrodes. Namely, at each of the intersections of the scanning lines 3a and the data lines 6a, the pixel switching TFT 30 is provided, in which the main line part of the corresponding scanning line 3a is opposed as a gate electrode to the channel region 1a'.

As shown in FIG. 5, the liquid crystal display device according to the embodiment includes the transparent TFT array substrate 10 and the transparent counter substrate 20 opposed to the TFT array substrate 10. The TFT array substrate 10 is, for example, a quartz substrate, a glass substrate, or a silicon substrate, and the counter substrate 20 is; for example, a glass substrate or a quartz substrate. The TFT array substrate 10 includes the pixel electrodes 9a formed thereon and an alignment film 16 provided on the pixel electrodes 9a, the alignment film 16 being subjected to predetermined orientation treatment such as rubbing or the like. The pixel electrodes 9a are composed of a transparent conductive film such as an ITO film. On the other hand, the counter substrate 20 includes the counter electrode 21 provided over the entire surface thereof, and an alignment film 22 provided below the counter electrode 21, the alignment film 22 being subjected to predetermined orientation treatment such as rubbing or the like. Like the pixel electrodes 9a, the counter electrode 21 is composed of a transparent conductive film such as an ITO film, and the alignment films 16 and 22 are each composed of a transparent organic film such as a polyamide film. The liquid crystal layer 50 assumes a predetermined orientation state formed by the alignment films 16 and 22 without the electric field applied from the pixel electrodes 9a.

As shown in FIG. 5, each of the TFTs 30 has a LDD (Lightly Doped Drain) structure and including, as components, the corresponding scanning line 3a functioning as the gate electrode as described above, the channel region 1a' of the semiconductor layer 1a which includes a polysilicon film and in which a channel is formed by an electric field from the scanning line 3a, an insulating film 2 including a gate insulating film for insulating between the scanning line 3a and the semiconductor layer 1a, and a low-concentration source region 1b, a low-concentration drain region 1c, a high-concentration source region 1d, and a high-concentration drain region 1e in the semiconductor layer 1a.

Although each of the TFTs 30 preferably has the LDD structure shown in FIG. 5, it may have an offset structure in which impurities are not implanted in the low-concentration source region 1b and the low-concentration drain region 1c or a self-alignment type in which a high concentration of impurities is implanted using as a mask the gate electrode including a part of the scanning line 3a to form a nigh-concentration source region and a high-concentration drain region in self alignment. In this embodiment, each of the pixel switching TFTs 30 has a single gate structure in which only one gate electrode is disposed between the high-concentration source region 1d and the high-concentration drain region 1e. However, two or more gate electrodes may be disposed therebetween. When each TFT is a dual gate, triple, or higher order gate type, a leakage current at the junctions between the channel and the source and drain regions is prevented, thereby decreasing an off-state current. Furthermore, the semiconductor layer 1a constituting each TFT 30 may be a non-single crystal layer or a single crystal layer. A single crystal layer may be formed by a known method such as a bonding method or the like. The semiconductor layer 1a comprising a single crystal layer improves, particularly, the performance of peripheral circuits.

On the other hand, in FIG. 5, the storage capacitor 70 includes a lower electrode 71 connected to the high-concentration drain region 1e of each TFT 30 and the pixel electrode 9a, and a capacity line 300 serving as an upper electrode, both electrodes being opposed to each other with a dielectric film 75 provided therebetween. The capacity line 300 is an example of the amorphous wiring according to the embodiment of the invention.

The lower electrode 71 is composed of, for example a conductive polysilicon film, and electrically connected to the high-concentration drain region 1e of each TFT 30 through a contact hole 83. Namely, the lower electrode 71 functions as a pixel potential-side capacitor electrode at the pixel potential. The lower electrode 71 has the function as an electric transit connection between the pixel electrode 9a and the high-concentration drain region 1e of the TFT 30 through contact holes 83 and 85 as well as the function as the pixel potential-side capacitor electrode. The lower electrode 71 may include a single layer film or multi-layer film containing a metal or an alloy.

As shown in FIG. 5, the dielectric film 75 is a relatively thin film having a thickness of, for example, about 5 to 300 nm, and includes a silicon oxide film such as a HTO (High Temperature Oxide) film or a LTO (Low Temperature Oxide) film, or a silicon nitride film. From the viewpoint of increasing the storage capacitor 70, the dielectric film 75 is preferably as thin as possible so long as the reliability of the film is sufficiently obtained.

The capacity line 300 functions as a fixed potential-side capacitor electrode opposed to the lower electrode 71. As show in FIG. 4, in a plan view, the capacity line 300 is formed to overlap the formation region of the corresponding scanning line 3a. More specifically, the capacity line 300 includes a main line part extending along the corresponding scanning line 3a, a projecting part projecting upward along the corresponding data line 6a from the intersection with the corresponding data line 6a in FIG. 4, and a constricted part in which a portion corresponding to the contact hole 85 is slightly constricted. The projecting part contributes to an increase in the formation region of the storage capacitor 70 by using a region above the corresponding scanning line 3a and a region below the corresponding data line 6a. The capacity line 300 is preferably disposed around the image display region 10a including the pixel electrode 9a disposed therein, and electrically connected to a constant potential source to be set at a fixed potential. Examples of the constant potential source include a positive power supply VDDX and a negative power supply VSSX which are adapted to the data line drive circuit 101 as described above, and a counter electrode potential LCCOM to be supplied to the counter electrode 21 of the counter substrate 20.

In particular, in this embodiment the capacity line 300 includes an amorphous WSi film 320 as an example of the amorphous film. Namely, the capacity line 300 has a two-layer film with a laminated structure in which an aluminum film 310 and the amorphous WSi film 320 are laminated in turn. In addition, as shown in FIGS. 4 and 5; the capacity line 300 is disposed above each of the TFTs 30 and in a region containing a region opposing the channel region 1a' of each TFT 30 in a plan view of the TFT array substrate 10. The aluminum film 310 is a film formed by depositing aluminum by sputtering, and the amorphous WSi film 320 is a film formed by laminating WSi in an amorphous state by sputtering. Instead of or in addition to the amorphous WSi film 320, an amorphous WSi film containing at least one of high-melting-point metals such as Ti (titanium) Cr (chromium), Ta (tantalum), and Mo (molybdenum), may be used as the amorphous film.

The amorphous WSi film 320 has a higher light-shielding ability as compared with a crystallized or solid light-shielding conductive film such as a WSi polycide film. Specifically; the OD value of the amorphous WSi film 320 is more than 4, i.e., the light transmittance of the amorphous WSi film 320 is less than 0.01%. Therefore, the light shielding ability is higher than that of a WSi polycide film having an OD value of about 1.2. Thus, the amorphous WSi film 320 securely shields the channel region 1a' of each TFT 30 from light incident from above. As a result, in an operation of the liquid crystal device, light leakage currents in the TFTs 30 are decreased, thereby suppressing or preventing the occurrence of flicker or image nonuniformity in an image display and permitting a high-quality image display.

If the capacity line 300 is formed using a crystallized light-shielding conductive film such as a WSi polycide film, heat treatment at, for example, 500° C. or more is performed for alloying after the light-shielding conductive film is laminated by sputtering. The heat treatment caused warping or cracking in the crystallized light-shielding conductive film such as a WSi polycide film due to the stress applied in alloying, thereby casing difficulty in functioning as wiring. However, in this embodiment, heat treatment at a high temperature, for example, 500° C. or more, may not be performed for forming the amorphous WSi film 320. In other words, in order to maintain the amorphous WSi film 320 in an amorphous state, the amorphous WSi film 320 is preferably kept at a temperature lower than 500° C., thereby causing substantially no or no warping or cracking in the amorphous WSi film 320. Therefore, there is substantially no or no possibility that a current does not flow through the amorphous WSi film 320 due to high resistance or disconnection. As a result, the amorphous WSi film 320 sufficiently functions as a part of the capacity line 300. Therefore, it may be possible to securely shield the channel region 1a' of each TFT 30 without causing complication of the laminated structure on the TFT array substrate 10. Furthermore, substantially no or no warping or cracking occurs in the capacity line 300, thereby improving the yield and improving the reliability of the device.

As described above, the capacity line 300 includes a two-layer film containing the aluminum film 310 and the amorphous WSi film 32u to decrease the resistance by the aluminum film 310. The capacity line 300 may include a single layer film of the amorphous WSi film 320 along or a multi-layer film further containing a metal film.

Furthermore, the capacity line 300 includes a two-layer film containing the aluminum film 310 and the amorphous WSi film 320, and thus a redundant wiring structure such as double wiring need not be formed by, for example, electrically connecting, through a contact hole, conductive films disposed in different layers with an interlayer insulating film provided therebetween, for decreasing the resistance or avoiding disconnection due to warping or cracking. Therefore, it may be possible to simplify the laminated structure and improve definition.

In FIGS. 4 and 5, a lower light-shielding film 11a is provided below the TFTs 30. The lower light-shielding film 11a has a lattice pattern and defines the aperture region of each pixel. Furthermore, the lower light-shielding film 11a shields the channel regions 1a of the TFTs 30 from return light from the lower side, such as light reflected from the back of the TFT array substrate 10 and light emitted from another light crystal device and passing through a synthesis optical system in a double plate type projector. The lower light-shielding film 11a includes a single layer or multilayer film containing a metal or an alloy. The aperture regions are also defined by the data lines 6a shown in FIG. 4 and the capacity lines 300 formed to cross the data lines oa. Like the capacity lines 300, the lower light-shielding film 11a is provided around the image display region, and connected to a constant potential source in order to avoid adverse effects of potential variations on the TFTs 30 in a first modified example of the first embodiment, like the capacity lines 300, the lower light-shielding film 11a may contain an amorphous WSi film. In this case, the lower light-shielding film 11a more securely shields the channel regions 1a' of the TFTs 30 from return light from the lower side.

In addition, an underlying insulating film 12 is also provided below the TFTs 30. The underlying insulating film 12 has the function to insulate the TFTs 30 from the lower light-shielding film 11a and the function to prevent roughening of the TFT array substrate 10 in surface polishing and changes in the characteristics of the pixel switching TFTs 30 due to dirt remaining after washing.

In addition, a first interlayer insulating film 41 is formed on the scanning lines 3a; the first interlayer insulating film 41 having the contact holes 81 connected to the high-concentration source regions 1d and the contact holes 83 connected to the high-concentration drain regions 1e.

The lower electrodes 71, the dielectric films 75, and the capacity lines 300 are formed on the first interlayer insulating film 41, and a second interlayer insulating film 42 is formed thereon, the second interlayer insulating film 42 having the contact holes 81 connected to the high-concentration source regions 1d and the contact holes 85 connected to the lower electrodes 71.

Furthermore, the data lines 6a are formed on the second interlayer insulating film 42, and a third interlayer insulating film 43 is formed thereon, the third interlayer insulating film 43 having the contact holes 85 connected to the lower electrodes 71.

In a second modified example of the first embodiment, like the capacity lines 300, the data lines 6a may contain an amorphous WSi film. In this case, the data lines 6a more securely shield the channel regions 1a' of the TFTs 30 from light incident from above.

In a third modified example of the first embodiment, like the capacity lines 300, the scanning lines 3a may contain an amorphous WSi film. In this case, the scanning lines 3a more securely shield the channel regions 1a' of the TFTs 30 from light incident from above.

In a fourth modified example of the first embodiment, like the capacity lines 300, the lower electrodes 71 may contain an amorphous WSi film. In this case, the lower electrodes 71 more securely shield the channel regions 1a' of the TFTs 30 from light incident from above.

As described above, in the liquid crystal device according to this embodiment, light leakage currents in the TFTs 30 may be decreased by the capacity lines 300 each including the amorphous WSi film 320 without causing complication of the laminated structure, thereby permitting a light-quality image display.

<Manufacturing Method>

A method for manufacturing the liquid crystal device according the embodiment of the invention will be described below with reference to FIGS. 6 to 9. FIGS. 6 to 9 are sectional views showing a series of manufacturing steps for manufacturing the liquid crystal device according to the embodiment of the invention. FIGS. 6 to 9 each correspond to a sectional view of the pixel portion of FIG. 5. Herein, description is mainly made of a process for manufacturing the storage capacitors, particularly, the capacity lines, in the liquid crystal device according to the embodiment of the invention.

First, as shown in FIG. 6, a laminated structure ranging from the lower light-shielding film 11a to the first interlayer insulating film 41 is formed in the image display region 10a on the TFT array substrate 10. In this step, the lower light-shielding film 11a is formed in a lattice pattern, and the underlying insulating film 12 and the first interlayer insulating film 41 are formed over the entire surface of the TFT array substrate 10. The underlying insulating film 12 includes a silicate glass film of NSG (nonsilicate glass), PSG (phosphosilicate glass), or BSG (boron-silicate glass), a nitride film, or a silicon oxide film and is formed by atmospheric pressure or reduced pressure CVD using TEOS (tetramethyl orthosillcate) gas, TEB (tetraethyl borate) gas, TMOP (tetramethyl oxyphosphate) gas, or the like. The thickness of the underlying insulating film 12 is, for example, about 500 nm to 2000 nm, and preferably about 800 nm. The TFTs 30 are formed in regions corresponding to the respective intersections of the scanning lines 3a and the data line 6a which are formed later. In order to form the TFTs 30, heat treatment such as annealing is performed to improve the characteristics of the TFTs 30. The annealing temperature is about 900° C. to 1300° C. and preferably, for example, about 1000° C. The first interlayer insulating film 41 includes a silicate glass film of NSG, PSG, or BSG, a nitride film, or a silicon oxide film and is formed by atmospheric pressure or reduced-pressure CVD using TEOS gas, TEB gas, TMOP gas, or the like. The thickness of the first interlayer insulating film 41 is, for example, about 500 mm to 2000 nm, and preferably about 800 nm. Preferably, annealing is performed at a high temperature of about 800° C. to improve the film quality of the first interlayer insulating film 41. In each of the processes, a usual semiconductor integration technique may be used. After the first interlayer insulating film 41 is formed, the surface thereof may be planarized by chemical polishing (Chemical Mechanical Polishing: CMP) or the like.

Next, predetermined portions of the surface of the first interlayer insulating film 41 are etched to form the contact holes 83 at a depth reaching the high-concentration drain regions 1e. Then, a conductive polysilicon film is deposited in a predetermined pattern to form the lower electrodes 71. The lower electrodes 71 are formed to be connected the high-concentration drain regions 1e through the contact holes 83. Then, a high-temperature silicon oxide film (HTO film) or a silicon nitride film is deposited to a thickness of, for example, about 30 nm, in a predetermined pattern to form the dielectric films 75.

Next, as shown in FIG. 7, the capacity lines 300 are formed in a predetermined pattern. Namely, aluminum is first deposited in a predetermined pattern to form the aluminum films 310.

Next, WSi is deposited in a predetermined pattern by sputtering to form the amorphous WSi films 320. In order to deposit WSi in an amorphous state, sputtering of WSi is preferably performed in an Ar (argon) gas atmosphere at a relative high pressure, for example, about 2 Pa, to decease the mean free path of sputtered particles. Alternatively, sputtering of WSi is preferably performed at a relatively low temperature of, for example, about 40° C. or room temperature or less or sputtering power is preferably decreased. Alternatively, the molar ratio of Si to W used as a target is preferably increased to deviate from 1:2, i.e., to set an unbalanced ratio. Furthermore, in a plan view of the TFT array substrate 10, the capacity lines 300 are formed in a predetermined pattern including regions which contain the regions opposing the channel regions 1a, of the respective TFTs 30. Therefore, the capacity lines 300 (particularly, the amorphous WSi films 320) securely shield the channel regions 1a' of the TFTs 30 from light incident from above. As a result, in an operation of the liquid crystal device, light leakage currents in the TFTs 30 are decreased to suppress or prevent the occurrence of flicker or pixel nonuniformity in the image display, thereby permitting a high-quality image display.

Figure 8:
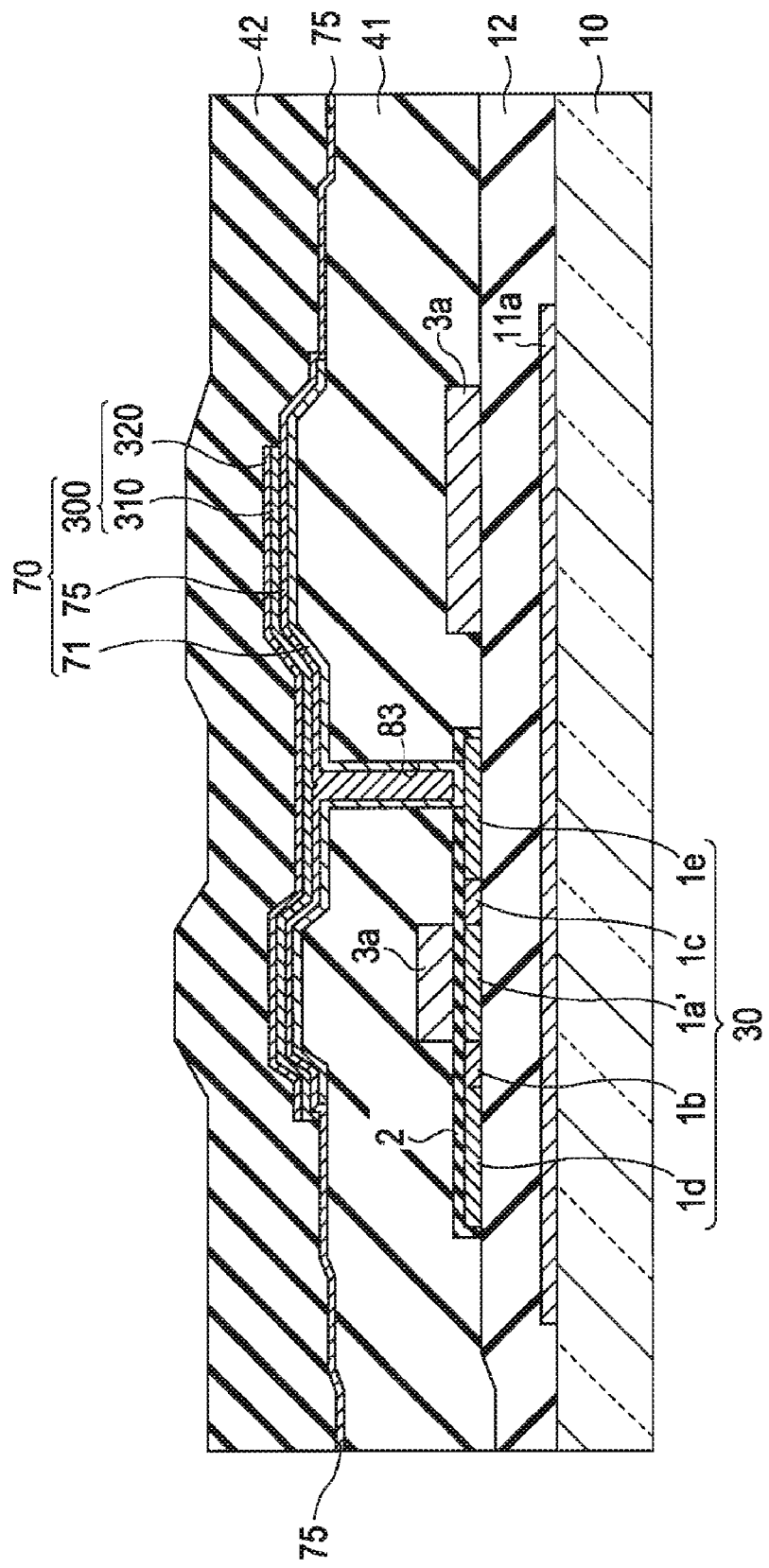
FIG. 8 is a sectional view showing a step of the method for manufacturing the liquid crystal device shown in FIG. 1.

Next, as shown in FIG. 8, in the embodiment, the second interlayer insulating film 42 including a silicate glass film of NSG, PSG, or BSG is formed over the entire surface of the TFT array substrate 10 by, for example, plasma CVD at less than 500° C. using TEOS gas. The thickness of the second interlayer insulating film 42 is, for example, about 400 nm. Therefore, in order to form the second interlayer insulating film 42, heat treatment at, for example, 500° C. or more, need not be performed. As a result, the amorphous WSi film 320 in each capacity line 300 is maintained in an amorphous state. The second interlayer insulating film 42 may be formed by high-density plasma CVD. After the second interlayer insulating film 42 is formed, the surface thereof may be planarized by CMP or the like.

Figure 9:
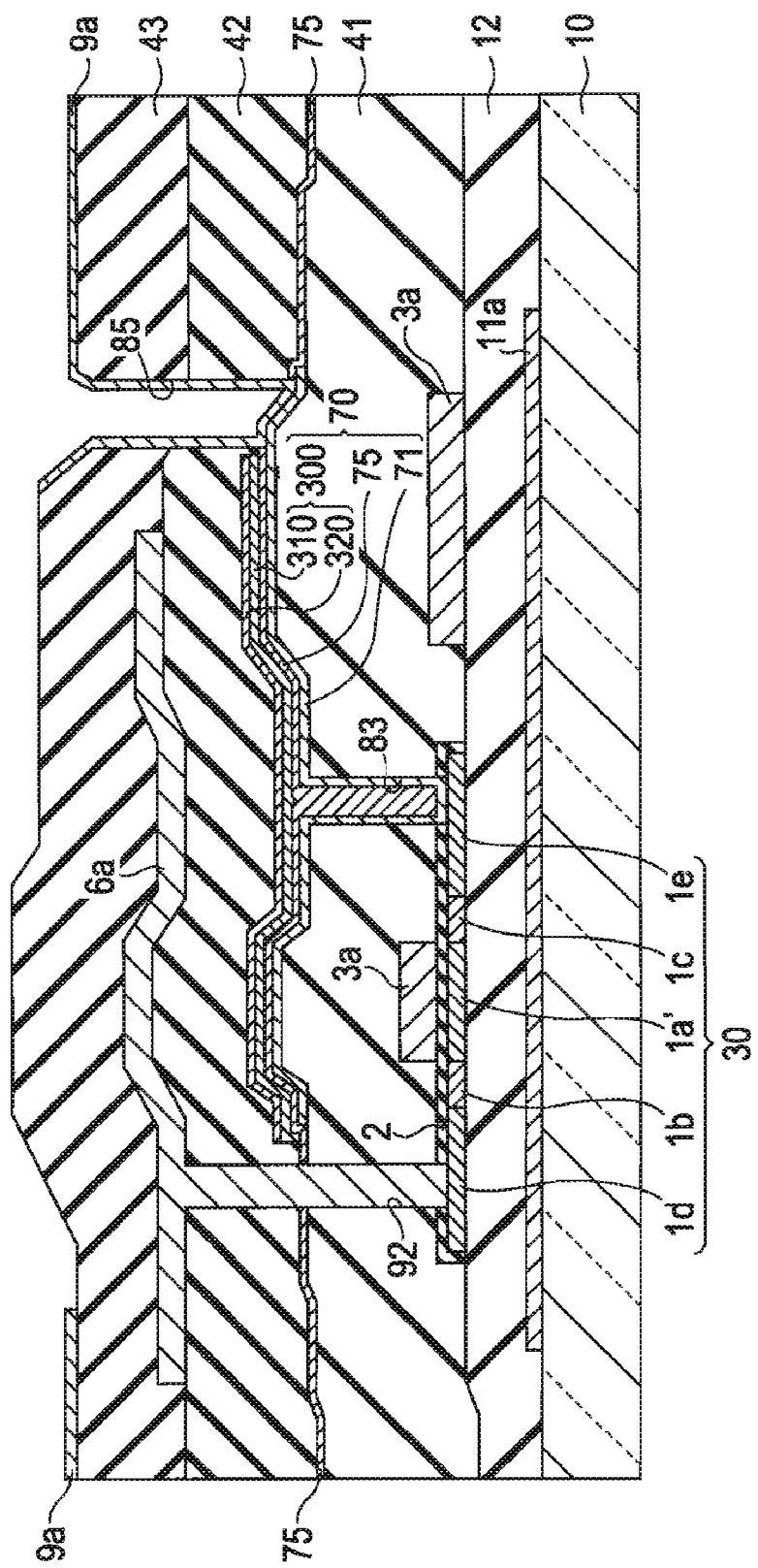
FIG. 9 is a sectional view showing a step of the method for manufacturing the liquid crystal device shown in FIG. 1.

Next, as shown in FIG. 9, predetermined portions of the surface of the second interlayer insulating film 42 are etched to form contact holes 92 at a depth reaching the high-concentration source regions 1d. Then, an aluminum film is deposited in a predetermined pattern to form the data lines 6a. The data lines 6a are connected to the high-concentration source regions 1d through the contact holes 92.

Next, B-PSG is deposited over the entire surface of the TFT array substrate 10 to form the third interlayer insulating film 43. The thickness of the third interlayer insulating film 43 is, for example, about 500 nm to 1500 nm, and preferably about 800 nm. The third interlayer insulating film 43 is not annealed at a high temperature of, for example, about 500° C. or more. For the third interlayer insulating film 43, silica glass such as NSG, PSG, or BPSG, silicon nitride, or silicon oxide may be used. After the third interlayer insulating film 43 is formed, the surface thereof may be planarized by CMP or the like.

Next, predetermined portions of the surface of the third interlayer insulating film 43 are etched to form contact holes 85 at a depth reaching the extending portions of the lower electrodes 71. Then, a transparent conductive film of ITO or the like is deposited in a predetermined pattern to form the pixel electrodes 9a. The pixel electrodes 9a are electrically trunk-connected to the high-concentration drain regions 1e through the extending portions of the lower electrodes 71.

According to the above-described method for manufacturing the liquid crystal device, the liquid crystal device according to the embodiment of the invention may be manufactured.

In this embodiment, in particular, the capacity lines 300 are formed to each include the amorphous WSi film 320, and thus light leakage currents in the TFTs 30 are decreased, thereby permitting a high-quality image display.

Furthermore, in this embodiment, in particular, the amorphous WSi film 320 is formed above each of the TFTs 30, and thus it may be possible to easily increase the light shielding ability by the amorphous WSi film 320 while improving the characteristics of the TFTs 30 by heat treatment such as annealing.

Furthermore, in this embodiment, in particular, heat treatment for heating the amorphous WSi films 320 at 500° C. or more is not performed after the amorphous WSi films 320 are formed. Therefore, it may be possible to maintain the amorphous WSi films 320 in an amorphous state, thereby suppressing or preventing the occurrence of warping or cracking due to crystallization and improving manufacture yield.

<Electronic Apparatus>

Next, description will be made of the application of a liquid crystal device serving as the electro-optic device described above to various electronic apparatuses.

Figure 10:
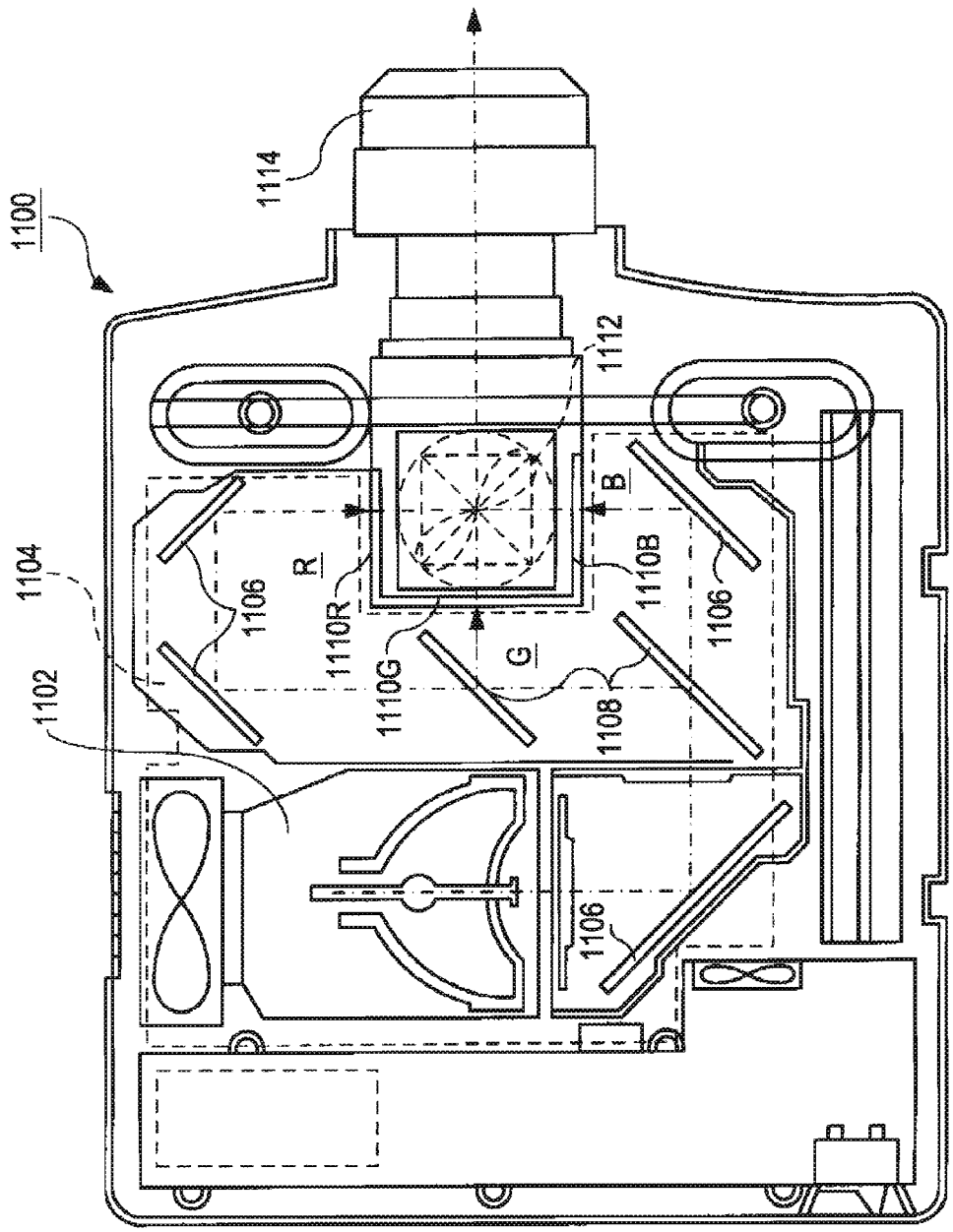
FIG. 10 is a plan view showing the constitution of a projector as an example of an electronic apparatus including an electro-optic device.

First, a projector using the liquid crystal device as a light valve is described. FIG. 10 is a plan view showing an example of the constitution of a projector. As shown in FIG. 10, a lamp unit 1102 including a white light source such as a halogen lamp is provided in a projector 1100. Projection light emitted from the lamp unit 1102 is separated into the three primary colors of RGB by four mirrors 1106 and two dichroic mirrors 1108 which are disposed in a light guide 1104, and are incident on liquid crystal panels 1110R, 1110B, and 1110G, respectively, serving as light valves for the primary colors.

Each of the liquid crystal panels 1110R; 1110B and 1110G has the same constitution as that of the above-descried liquid crystal device and is driven by a primary color signal of R, G, or B supplied from an image signal processing circuit. Light modulated by the liquid crystal panels is incident on a dichroic prism 1112 from three directions. In the dichroic prism 1112, lights of R and B are refracted at 90°, while light of G travels straight. Therefore, images of the respective colors are combined to project a color image on a screen through a projection lens 1114.

Now, a display image of each of the liquid crystal panels 1110R, 1110B, and 1110G is taken into consideration. A display image of the liquid crystal panel 1110G is preferably mirror-reversed with respect to display images of the liquid crystal panels 1110R and 1110B.

Since lights of the primary colors R, G, and B are incident on the liquid crystal panels 1110R, 1110G, and 1101B, respectively, through the diachronic mirrors 1108, a color filter need not be provided.

Besides the electronic apparatus described above with reference to FIG. 10, electronic apparatuses include a mobile personal computer, a cellular phone, a liquid crystal television, a view finder-type or monitor direct view-type video tape recorder, a car navigation system, a pager, an electronic notebook, an electric calculator, a word processor, a work station, a picture telephone, a POS terminal, and an apparatus with a touch panel. The present invention may be applied to these various electronic apparatuses.

The present invention is not limited to the above-described embodiments, and appropriate modifications may be made within the scope of the gist or idea of the invention which may be read from the claims and the whole of the specification. The technical field of the invention includes electro-optic devices having such modifications, method for manufacturing the electro-optic devices, and electronic apparatuses including the electro-optic devices.

The entire disclosure of Japanese Patent Application No. 2005-37076, filed Dec. 27, 2005 is expressly incorporated by reference herein.

What is claimed is:

1. A method for manufacturing an electro-optic device including a data line and a scanning line extending to cross each other on a substrate, a pixel electrode disposed on the substrate for the pixel defined corresponding to the data line and the scanning line in a plan view of the substrate, a thin film transistor electrically connected to the pixel electrode, a storage capacitor including a first electrode and second electrode that is disposed above the thin film transistor and in a region opposite to a channel region of the thin film transistor, and an interlayer insulating film, the method comprising:

forming the scanning line on the substrate;
forming the thin film transistor in a region corresponding to the intersection of the data line and the scanning line in the plan view of the substrate;
forming the first electrode that functions as a capacity line above the thin film transistor and opposite to the channel region of the thin film transistor in the plan view of the substrate, the forming the first electrode including:
forming an aluminum film by sputtering, and
forming an amorphous WSi film on the aluminum film by sputtering;
forming the interlayer insulating film on the capacity line by plasma CVD using TEOS gas;
forming the data line on the substrate; and
forming the pixel electrode for the pixel.

2. The method according to claim 1, further comprising:
performing at least one heat treatment for heating at least one of the data line, the scanning line, the thin film transistor, and the pixel electrode at 500° C. or more;
wherein the at least one heat treatment is performed before the formation of the first electrode.

* * * * *